(12) United States Patent
Liaw

(10) Patent No.: US 8,390,033 B2
(45) Date of Patent: Mar. 5, 2013

(54) METAL STRUCTURE FOR MEMORY DEVICE

(75) Inventor: Jhon Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 794 days.

(21) Appl. No.: 12/390,668

(22) Filed: Feb. 23, 2009

(65) Prior Publication Data

US 2010/0213514 A1    Aug. 26, 2010

(51) Int. Cl.
*H01L 27/118* (2006.01)
(52) U.S. Cl. .. 257/206; 257/207; 257/258; 257/E21.661
(58) Field of Classification Search ................ 257/206, 257/207, 258, E21.661
See application file for complete search history.

(56) References Cited

U.S. PATENT DOCUMENTS

| | | | |
|---|---|---|---|
| 6,445,041 B1 * | 9/2002 | Ishida | 257/369 |
| 6,597,041 B2 * | 7/2003 | Ohbayashi | 257/369 |
| 6,922,354 B2 * | 7/2005 | Ishikura et al. | 365/154 |
| 7,233,032 B2 | 6/2007 | Liaw | |
| 7,289,056 B2 | 10/2007 | Liu et al. | |
| 2006/0038234 A1 * | 2/2006 | Liaw | 257/368 |
| 2007/0235765 A1 * | 10/2007 | Liaw | 257/207 |
| 2007/0262399 A1 | 11/2007 | Dewey et al. | |

* cited by examiner

*Primary Examiner* — John C Ingham
(74) *Attorney, Agent, or Firm* — Haynes and Boone, LLP

(57) ABSTRACT

A semiconductor device is provided that includes a substrate, a static random access memory (SRAM) unit cell formed in the substrate, a first metal layer formed over the substrate, the first metal layer providing local interconnection to the SRAM unit cell, a second metal layer formed over the first metal layer, the second metal layer including: a bit line and a complementary bit line each having a first thickness and a Vcc line disposed between the bit line and the complementary bit line, and a third metal layer formed over the second metal layer, the third metal layer including a word line having a second thickness greater than the first thickness.

19 Claims, 5 Drawing Sheets

METAL STRUCTURE FOR MEMORY DEVICE

BACKGROUND

The physical dimension of a feature on a chip is referred to as "feature size." Reducing the feature size on a chip permits more components to be fabricated on each chip, and more components to be fabrication on each silicon wafer, thereby reducing manufacturing costs on a per-wafer and a per-chip basis. Increasing the number of components in each chip can also improve chip performance because more components may become available to satisfy functional requirements.

SRAM devices are one type of device that may undergo such scaling to reduce manufacturing costs. SRAM is random access memory that retains data bits in its memory as long as power is being supplied. Unlike dynamic random access memory (DRAM), SRAM does not have to be periodically refreshed. SRAM also provides faster access to data than DRAM. Thus, for example, SRAM is frequently employed in a computer's cache memory, or as part of the random access memory digital-to-analog converters in video cards. A split word line SRAM cell has been used for the layout due to its friendly lithography layout shapes as well as a shorter bit line for speed improvement. However, as feature sizes continue to shrink in future technologies, there is concern about the metal conductors with respect to RC delay and noise coupling.

SUMMARY

One of the broader forms of the present disclosure involves a semiconductor device that includes: a substrate; a static random access memory (SRAM) unit cell formed in the substrate; a first metal layer formed over the substrate, the first metal layer providing local interconnection to the SRAM unit cell; a second metal layer formed over the first metal layer, the second metal layer including: a bit line and a complementary bit line each having a first thickness; and a Vcc line disposed between the bit line and the complementary bit line; and a third metal layer formed over the second metal layer, the third metal layer including a word line having a second thickness greater than the first thickness.

Another of the broader forms of the present disclosure involves a memory device that includes: a memory unit cell formed in a substrate; a first metal layer formed over the substrate, the first metal layer providing local interconnection to the memory unit cell; a second metal layer formed over the first metal layer, the second metal layer including a first bit line, a second bit line, and a supply line disposed between the first and second bit lines; and a third metal layer formed over the second metal layer, the third metal layer including a word line. A length ratio of the word line to the first bit line is greater than about 2.0 in the memory unit cell. The first bit line has a first resistance and the word line has a second resistance less than the first resistance.

Still another of the broader forms of the present disclosure involves a method that includes: providing a substrate; forming an SRAM unit cell in the substrate; forming a first metal layer over the substrate, the first metal layer providing local interconnection to the SRAM unit cell; forming a second metal layer over the first metal layer, the second metal layer including a bit line, a complementary bit line, and a Vcc line disposed between the bit line and the complementary bit line, the bit line and the complementary bit line each having a first thickness; and forming a third metal layer over the second metal layer, the third metal layer including a word line having a second thickness less than the first thickness.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
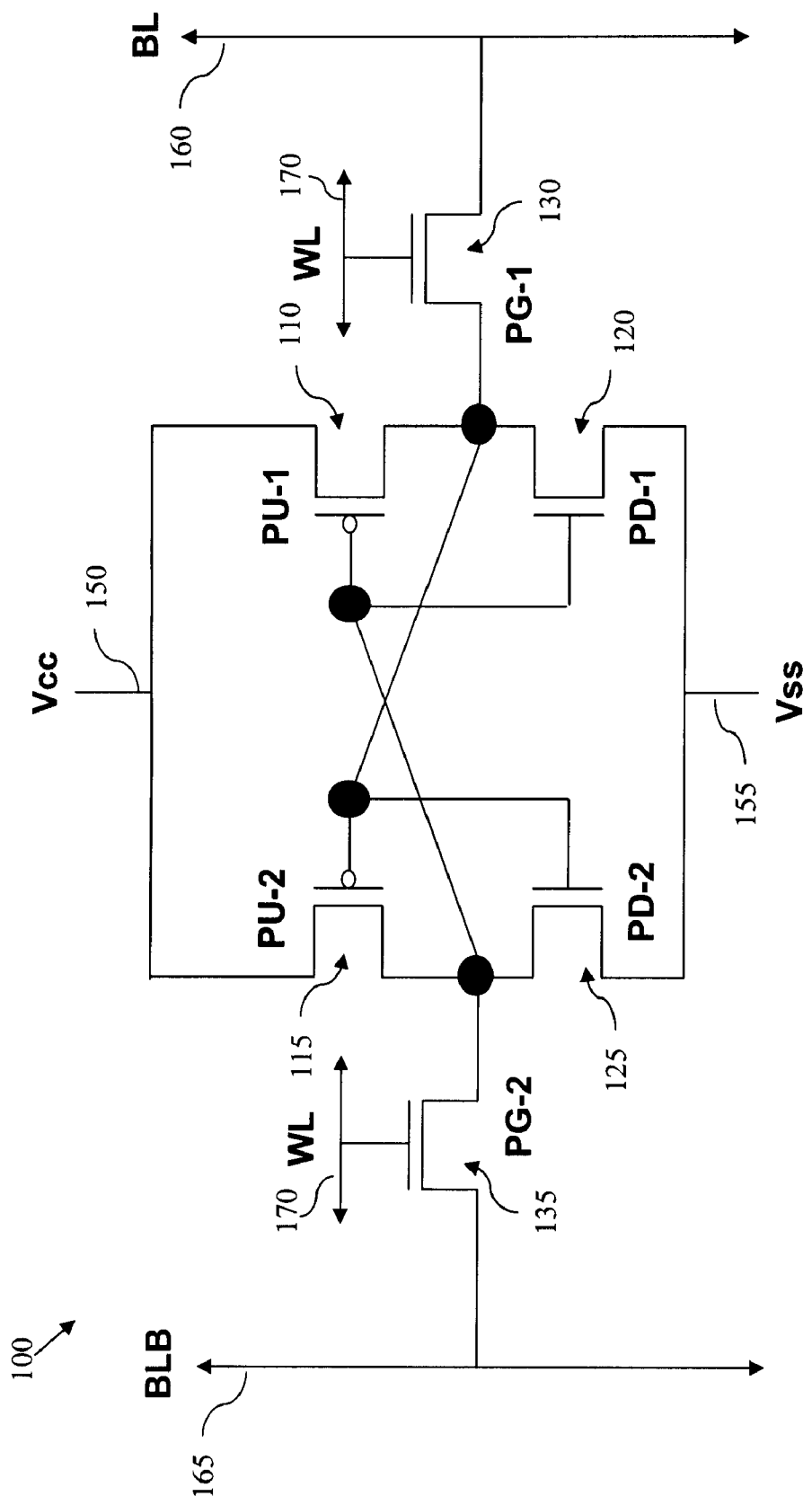
FIG. 1 illustrates a diagrammatic view of one embodiment of an SRAM device according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a circuit diagram of one embodiment of a memory cell. The circuit shown is an embodiment of an SRAM memory cell, the cell designated by reference numeral 100. The memory cell 100 comprises a circuit that has two (2) cross-latch CMOSFET inverters forming a flip-flop and two pass-gate transistors (also referred to as pass transistors, access transistors, active transistors). The circuit includes pull-up transistors (PU-1, PU-2) 110, 115, and pull-down transistors (PD-1, PD-2) 120, 125, as well as pass-gate transistors (PG-1, PG-2) 130, 135. The pull-up transistors as defined in this disclosure can be transistors that pull either towards Vcc or Vss. In this embodiment, the memory cell 100 functions by the pull-up transistors pulling toward Vcc.

In one embodiment, the pull-up transistors (PU-1, PU-2) 110, 115 are PMOS transistors, whereas the pull-down transistors (PD-1, PD2) 120, 125 and pass-gate transistors (PG-1, PG-2) 130, 135, are NMOS transistors, although other configurations of NMOS and PMOS transistors are within the scope of the present disclosure. Further, additional NMOS and/or PMOS transistors may be implemented in the SRAM memory cell 100. For example, read port transistors or additional pass-gate transistors may be implemented to provide read/write functionality and data storage.

The sources of pull-up transistors (PU-1, PU-2) 110, 115 are electrically coupled to a power source, such as Vdd, (hereinafter referred to as Vcc) 150. The drain of the pull-up transistor (PU-1) 110 is electrically coupled to the source of the pass gate transistor (PG-1) 130, the source of pull-down transistor (PD-1) 120, and the gate of pull-up transistor (PU-2) 115. Similarly the drain of pull-up transistor (PU-2) 115 is electrically coupled to the source of pass gate transistor (PG-2) 135, the source of pull-down transistor (PD-2) 125, and the gate of pull-up transistor (PU-1) 110. The drains of the pull-down transistors (PD-1, PD-2) 120, 125 are electrically coupled to a ground, common or Vss (herein after referred to as Vss collectively) 155. Additionally, the gates of pull-up transistor (PU-1) 110 and pull-down transistor (PD-1) 120 and the gates of pull-up transistor (PU-2) 115 and pull-down transistor (PD-2) 125, respectively, are electrically coupled.

The drains of the pass-gate transistors (PG-1, PG-2) 130, 135 are electrically coupled to a read port bit line (BL) 160 and a complementary read port bit line (bit line bar or BLB) 165, respectively. The gates of the pass-gate transistors (PG-1, PG-2) 130, 135 are electrically coupled to a write port word line (WL) 170. The read port bit (BL) and complementary read port bit lines (BLP) 160, 165 and the write port word line (WL) 170 may extend to other SRAM cells and/or other components, including row and column latch, decoder, and select drivers, control and logic circuitry, sense amps, muxes, buffers, etc.

Figure 2:
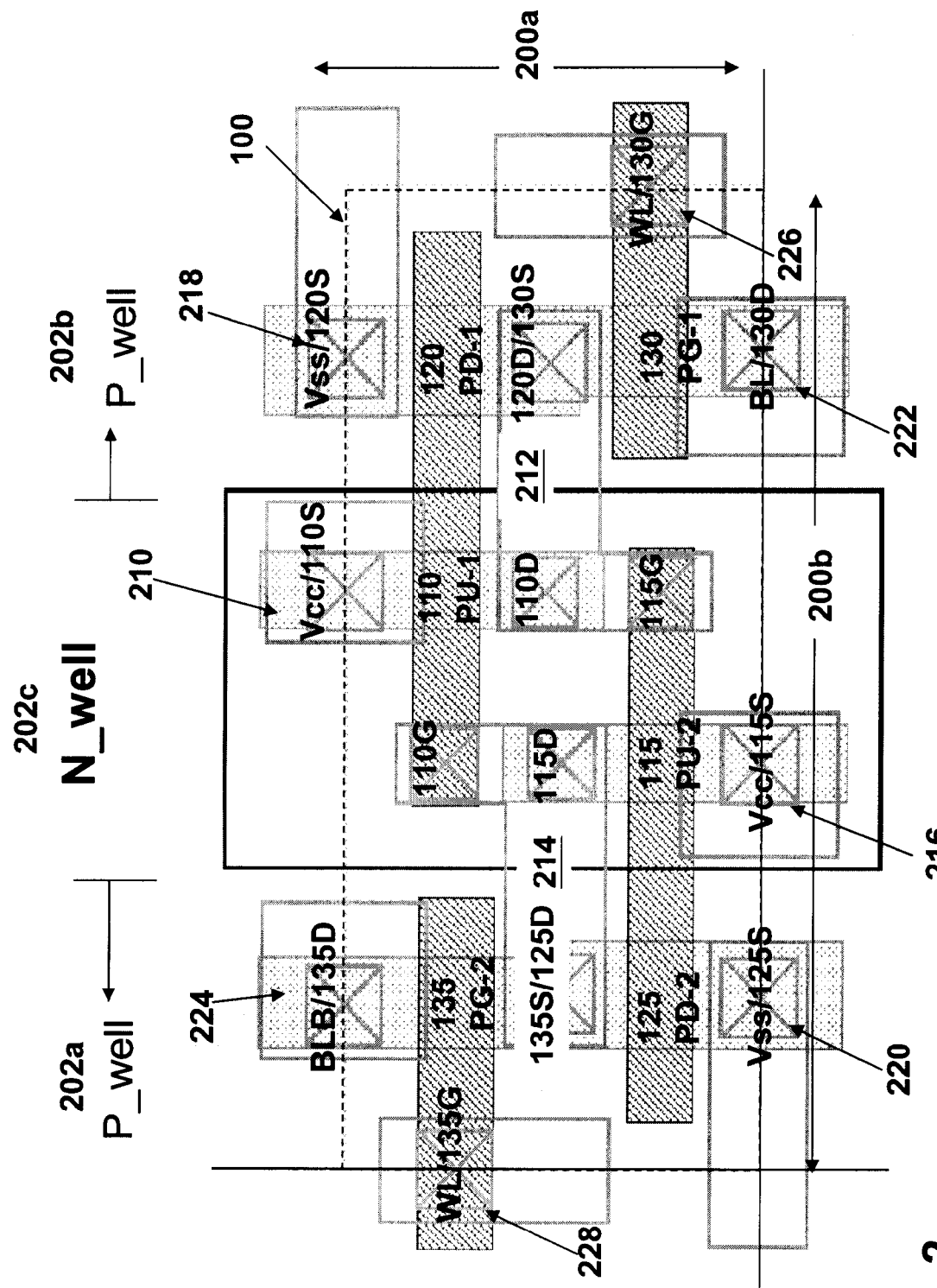
FIG. 2 illustrates a layout view of one embodiment of the SRAM device of FIG. 1 at an intermediate stage of fabrication.

Referring to FIG. 2, illustrated is one embodiment of a layout view of the memory cell 100 of FIG. 1. It should be noted that nodes of the pull-up transistors (PU-1 and PU-2) 110, 115, pull-down transistors (PD-1 and PD-2) 120, 125, and pass-gate transistors (PG-1 and PG-2) 130, 135 include a gate (G), source (S), and drain (D). For example, the pull-up transistor (PU-1) 110 includes the gate node 110G, source node 110S, and drain node 110D. The memory cell 100 includes an N_well region 202c interposing P-well regions 202a and 202b that are parallel to a width 200a of the cell 100. The memory cell 100 has a length 200b that extends across the P-well regions 202a, 202b, and the N-well region 202c. Features have a smaller pitch in a direction along the width 200a of the memory cell 100 as compared to the length 200b of the memory cell. A contact 210 connects the source node 110S of pull-up transistor (PU-1) 110 to a power source Vcc 150. A contact 212 connects the drain node 110D of pull-up transistor (PU-1) 110 to the source node 130S of pass-gate transistor (PG-1) 130, the drain node 120D of pull-down transistor (PD-1) 120, and the gate node 115G of pull-up transistor (PU-2) 115. Similarly, a contact 216 connects the source node 115S of pull-up transistor (PU-2) 115 to the power source Vcc 150. A contact 214 connects the drain node 115D of pull-up transistor (PU-2) 115 to the source node 135S of pass-gate transistor (PG-2) 135, the drain node 125D of pull-down transistor (PD-2) 125, and the gate node 110G of pull-up transistor (PU-1) 110. Contacts 218 and 220 connect the source nodes 120S, 125S of pull-down transistors (PD-1, PD-2) 120, 125 to a ground, common or Vss 155, respectively.

It should be noted that FIG. 2 only illustrates a lower level metal layer (e.g., M1). Although not shown in FIG. 2, the bit lines (BL, BLB) 160, 165 also run parallel to the width 200a of the cell 100, while the word line (WL) 170 runs perpendicular to the width of the cell. In the present embodiment, the bit lines (BL, BLB) 160, 165 and word line (WL) 170 are run in metal layers shown in the following figures. A contact 222 connects the drain node 130D of pass-gate transistor (PG-1) 130 with the bit line (BL) 160. A contact 224 connects the drain node 135D of pass-gate transistor (PG-2) 135 with the complementary bit line (BLB) 165. A contact 226 connects the gate node 130G of pass-gate transistor (PG-1) 130 with the word line WL. A contact 228 connects the gate node 135G of pass-gate transistor (PG-2) 135 with the word line WL. The P_well 202a supports transistors (PD-2 and PG-2) 125 and 135, while the P_well 202b supports transistors (PD-1 and PD-2) 120 and 130. The N_well region 202c supports transistors (PU-1 and PU-2) 110 and 115. It is understood, however, that various other layouts would be evident to one skilled in the art. Further, it is understood that the various transistors disclosed herein may be fabricated by a CMOS process flow as is known in the art, and thus the various materials, features, and structures that form the transistors are not described in detail herein.

Figure 3:
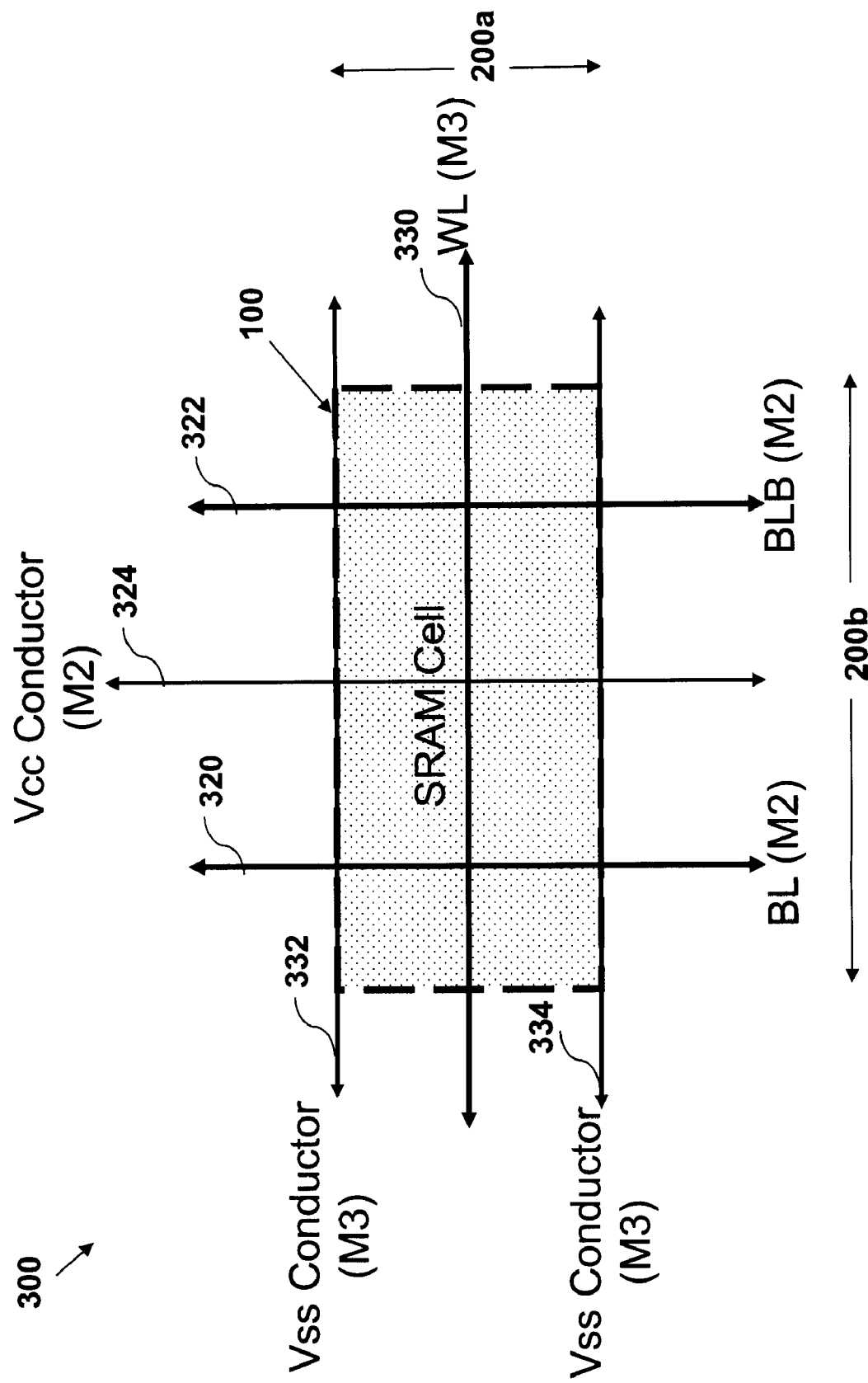
FIG. 3 illustrates a diagrammatic view of one embodiment of a metal routing scheme in the SRAM device of FIG. 1.

Referring to FIG. 3, illustrated is a diagrammatic view of a metal routing scheme 300 that may be implemented in the memory cell 100 of FIG. 1. The metal routing scheme 300 includes a plurality of metal layers (e.g., M1, M2, M3, etc.) that are formed over previously formed features and/or layers. The metal layers may include one or more layers comprising aluminum, gold, copper, silver, tungsten, titanium, titanium nitride, tantalum, tantalum nitride, alloys thereof, and/or other materials. Although not limited within the scope of the present disclosure, the metal layers may be formed by imprint lithography, immersion photolithography, maskless photolithography, CVD, PECVD, PVD, ALD, and/or other processes. The metal layers may also be formed by selective deposition or blanket deposition followed by a patterning process. It should be noted that thicknesses of the metal layers vary with respect to each other to improve device performance as will be discussed below.

A first metal layer (M1) includes interconnections of the various transistors of the memory cell 100 as was discussed above in FIGS. 1 and 2. Additionally, the first metal layer (M1) provides the landing pads of Vcc, Vss, word line (WL), and bit line lines (BL, BLB). Various contacts may extend between various components of the first metal layer (M1) and underlying features. The contacts may be formed by processes similar to those employed to form the metal layer, and may be formed prior to formation of the metal layer. For example, the contacts may be formed by a damascene or dual-damascene process as part of the processes employed to form the metal layer. Of course, other features or components may interpose the first metal layer and the underlying features for interconnection thereof, either in addition to or in the alternative to one or more of the contacts. Further, it is understood that other interconnection schemes may be implemented and are also within the scope of the present disclosure.

A second metal layer (M2) is formed over the first metal layer (M1). The second metal layer (M2) includes a bit line (BL) conductor 320 (for the bit line 160 of FIG. 1) and a complementary bit line (BLB) conductor 322 (for the complementary bit line 165 of FIG. 1). The bit and complementary bit line (BL, BLB) conductors 320, 322 run parallel with the width 200a of the memory cell 100. The second metal layer (M2) further includes a Vcc conductor 324 (for Vcc 150 of FIG. 1) that also runs parallel with the width 200a of the memory cell 100 and is disposed between the bit line and complementary bit line (BL, BLB) conductors 320, 322. Various contacts may extend between various components of the first and second metal layers. The contacts (and many other contacts described herein) may be or comprise a landing pad for receiving a subsequently formed contact or via. Of course, other features or components may interpose the first and second metal layers for interconnection thereof, either in addition to or in the alternative to one or more of the contacts.

A third metal layer (M3) is formed over the second metal layer (M2). The third metal layer (M3) includes a word line (WL) conductor 330 (for the word line 170 of FIG. 1) that runs parallel with the length 200b of the memory cell 100. The third metal layer (M3) further includes Vss conductors 332, 334 that also run parallel with the length 200b of the memory cell 100 and are disposed at opposite boundaries of the memory cell 100. The Vss conductors 332, 334 are a continuous Vss line in the memory cell 100. The word line (WL) conductor 330 is disposed between the Vss conductors 332, 334. It is understood that the Vss conductors 332, 334 are each disposed between the word line (WL) conductor 330 and another word line conductor of an adjacent memory cell (not shown). It should be noted that the word line (WL) conductor 330 has a greater length (e.g., 2 times or greater) than the bit line and complementary bit line (BL and BLB) conductors 320, 322 in the memory cell 100 for the purpose of high bit line speed, short bit line, and lower bit line coupling capacitance. Various contacts may extend between various components of the second and third metal layers. The contacts (and many other contacts described herein) may be or comprise a landing pad for receiving a subsequently formed contact or via. Of course, other features or components may interpose the second and third metal layers for interconnection thereof, either in addition to or in the alternative to one or more of the contacts.

Figure 4:
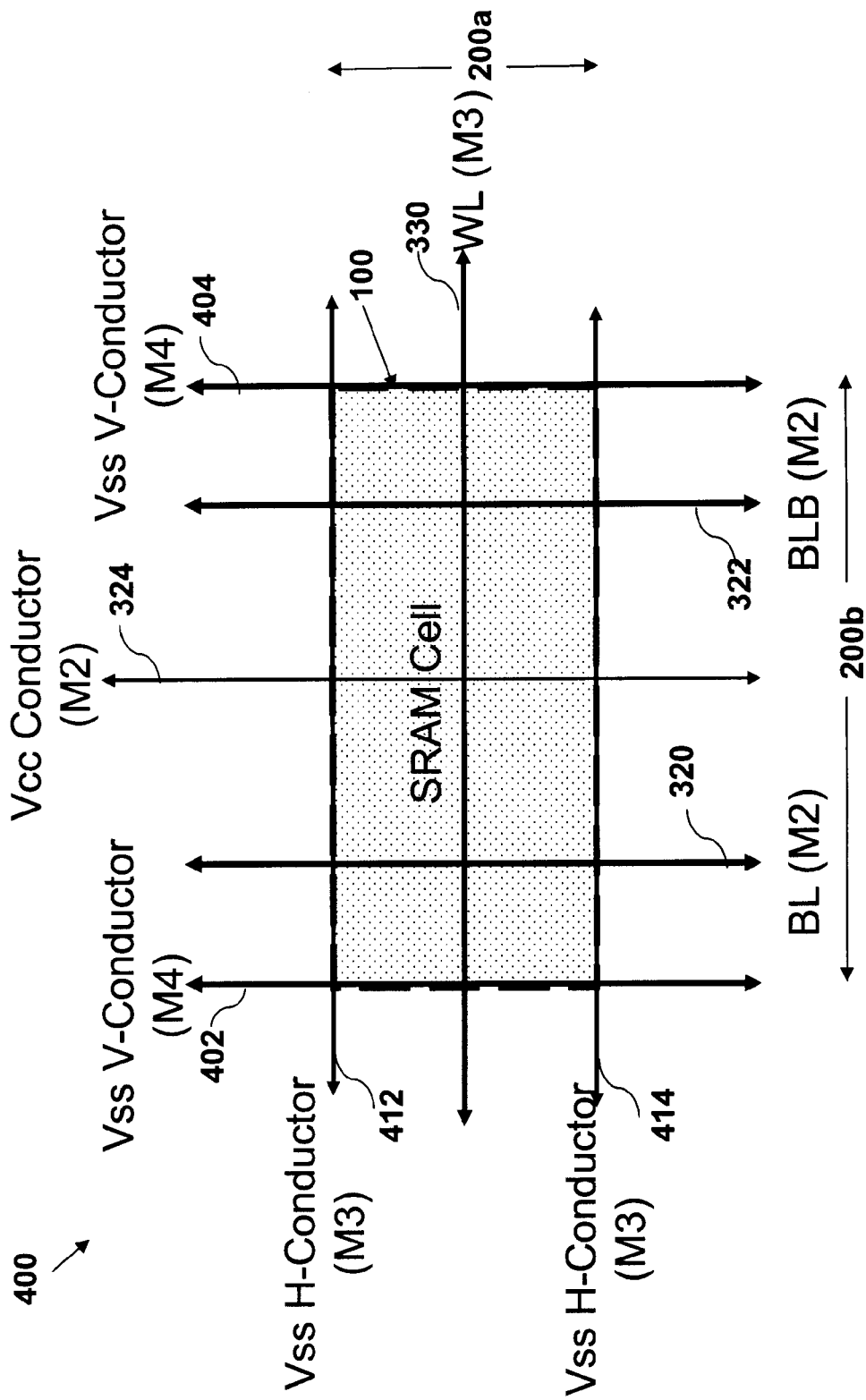
FIG. 4 illustrates a diagrammatic view of another embodiment of a metal routing scheme in the SRAM device of FIG. 1.

Referring to FIG. 4, illustrated is a diagrammatic view of an alternative metal routing scheme 400 that may be implemented in the memory cell 100 of FIG. 1. The metal routing scheme 400 includes a plurality of metal layers (e.g., M1, M2, M3, M4 etc.) that are formed over previously formed features and/or layers. The metal routing scheme 400 is similar to the metal routing scheme 300 of FIG. 3 except for differences discussed below. Accordingly, similar features in FIGS. 3 and 4 are numbered the same for the sake of simplicity and clarity. The metal routing scheme 400 includes a fourth metal layer (M4) formed over the third metal layer (M3). The fourth metal layer (M4) includes vertical Vss conductors (Vss V-Conductor) 402, 404 that run parallel with the width 200a of the memory cell 100 and perpendicular to the horizontal Vss conductors (Vss H-conductors) 412, 414. The vertical Vss conductors (Vss V-Conductor) 402, 404 are disposed at opposite boundaries of the memory cell 100. The vertical Vss conductors 402, 404 are electrically coupled to the horizontal Vss conductors (Vss H-Conductors) 412, 414 in the third metal layer (M3) by way of contacts. Of course, other features or components may interpose the third and fourth metal layers for interconnection thereof, either in addition to or in the alternative to one or more of the contacts. It should be noted that thicknesses of the metal layers may vary with respect to each other to improve device performance as will be discussed below.

Figure 5:
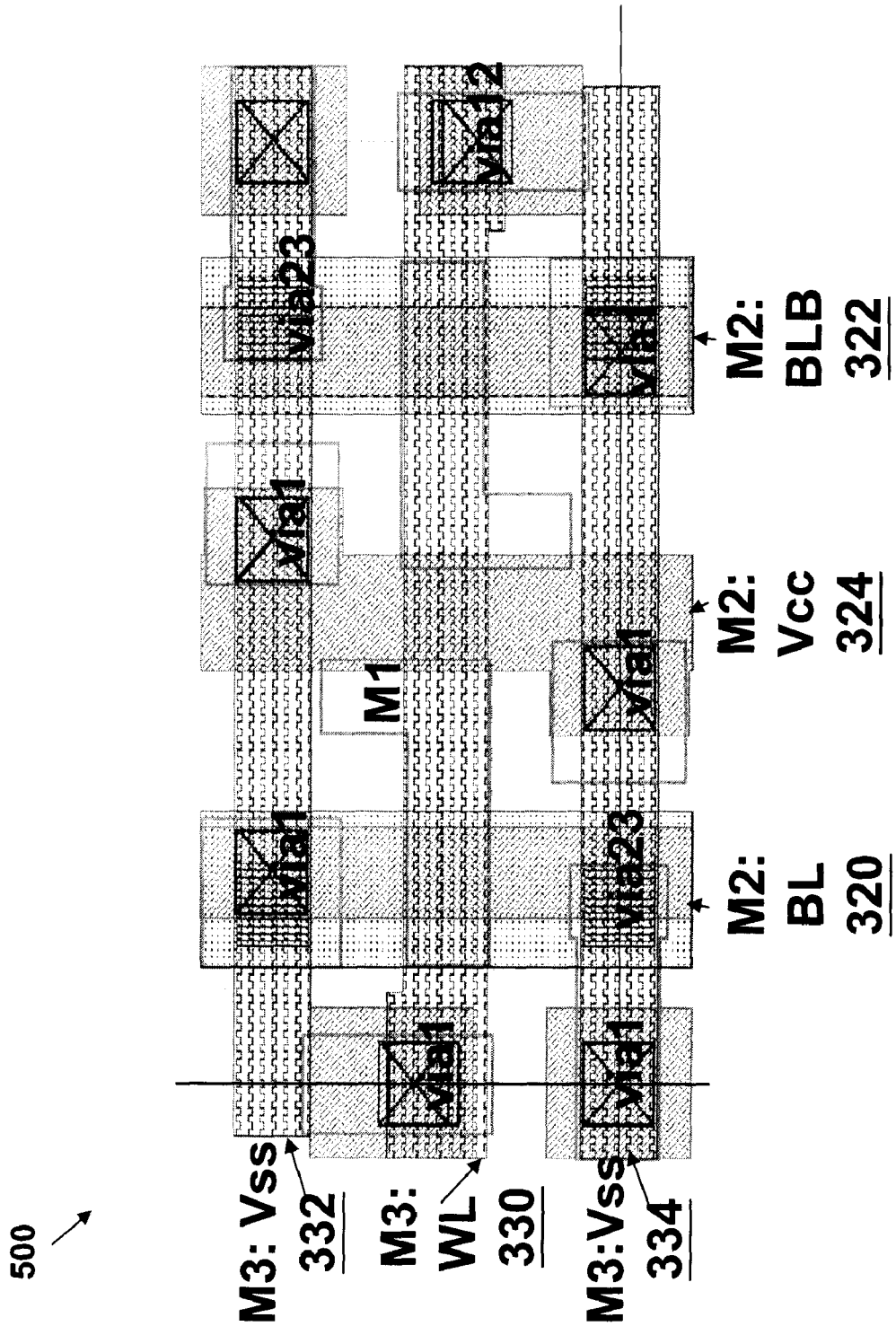
FIG. 5 illustrates a layout view of one embodiment of a metal routing scheme at an intermediate stage of fabrication.

Referring to FIG. 5, illustrated is one embodiment of a layout 500 of the metal routing scheme 300 of FIG. 3 at an intermediate stage of fabrication with three metal layers M1, M2, and M3. Similar features in FIGS. 3 and 5 are numbered the same for the sake of simplicity and clarity. It is understood that the layout 500 may also be implemented in the metal routing scheme 400 of FIG. 4 in a similar manner. The first metal layer (M1) serves as a conductive layer for interconnections of the various transistors in the memory cell 100. The first metal layer (M1) also provides the landing pads of Vcc, Vss, word line (WL), and bit lines (BL, BLB). A second metal layer (M2) serves as a conductive layer for the Vcc conductor 324, bit line conductor (BL) 320, and complementary bit line (BLB) conductor 322. A third metal layer (M3) serves as a conductive layer for the Vss conductors 332, 334 and word line (WL) conductor 330. In this example, the word line WL conductor 330 is located between the first Vss conductor 332 and the second Vss conductor 334.

The third metal layer (M3) is electrically coupled to the source nodes 120S, 125S of pull-down transistor (PU-1, PU-2) 120, 125 of FIG. 1, or the gate nodes 130G, 135G of pass-gate transistors (PG-1, PG-2) 130, 135 of FIG. 1 by way of a path. For example, the path comprises a contact between the second and third metal layers (via23), a second metal layer landing pad, a contact between the first and second metal layers (via12), a first metal layer landing pad, and a contact layer (via1). The first, second, and third metal layers (M1, M2, M3) follow a sequence from the lowest metal layer to the highest metal layer.

It has been observed that performance of an SRAM device having layouts of the metal routing schemes 300 and 400 of FIGS. 3 and 4, respectively, may be adversely effected as device features (or feature sizes) continue to shrink. For example, for larger memory arrays there will be more rows (e.g., more bits per bit line (BL, BLB)) and more columns (e.g., more bits per word line (WL)). The increase in rows may induce higher bit line coupling capacitance, and thus may degrade BL/BLB differential speed. The increase in columns may induce a longer word line, and thus may result in worse total metal resistance. There is concern regarding the metal conductors with respect to RC delay and noise coupling in high-speed applications.

Accordingly, metal structures having both a lower bit line coupling/loading effect and a lower word line resistance are achieved with the various embodiments disclosed herein which may be use in embedded memory applications, system-on-chip (SoC) applications, and other suitable applications. The word line (WL) conductors of the third metal layer (M3) has a greater thickness than the bit and complementary bit line (BL, BLB) conductors of the second metal layer (M2). In some embodiments, the metal thickness ratio of the word line (WL) conductor to the bit line (BL) conductor (thickness of WL: thickness of BL) is 1.05 or greater. In other embodiments, the metal thickness ratio of the word line (WL) conductor to the bit line (BL) conductor (thickness of WL: thickness of BL) is 1.15 or greater. Accordingly, a resistance of the word line (WL) conductor is less than a resistance of the bit line and complementary bit line (BL, BLB) conductors. Further, the metal conductors of the fourth metal layer (M4) may also have a greater thickness than the metal conductors of the third metal layer (M3). In some embodiments, the thickness ratio of the fourth metal layer to the third metal layer is 1.1 or greater. Additionally, the metal conductors of the second metal layer (M2) may have a greater thickness than the metal conductors of the first metal layer (M1).

After the features shown above have been formed, the SRAM device may be completed by conventional and/or future-developed processes. For example, additional metal layers may be formed over third metal layer in the FIG. 3 or the fourth metal layer shown in FIG. 4, such as for the further interconnection of the SRAM device with other devices or components, including other SRAM devices, in the chip and/or wafer in which the SRAM device is incorporated. In one embodiment, multiple instances of the memory cell 100 may be substantially repeated to form an SRAM array.

In summary, aspects of the present disclosure provide various embodiments of a metal structure with varying metal thicknesses for lowering a coupling/loading effect of the bit line and for lowering a resistance of the word line. More specifically, the metal thickness of the word line (WL) is greater than the metal thickness of the bit lines (BL, BLB) in the SRAM cell. Accordingly, the word line has a smaller resistance than the bit lines in the memory cell. The embodiments disclosed herein are well suited for high-speed applications even as feature sizes continue to shrink. Thus, the SRAM cell structure disclosed herein has a lower RC loading effect which becomes a very important factor in various applications such as embedded memory applications and system-on-chip (SoC) applications. It is understood that different embodiments disclosed herein offer several different advantages, and that no particular advantage is necessarily required for all embodiments.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A semiconductor device, comprising:
   a substrate;
   a static random access memory (SRAM) unit cell formed in the substrate;
   a first metal layer formed over the substrate, the first metal layer providing local interconnection to the SRAM unit cell;
   a second metal layer formed over the first metal layer, the second metal layer including:
      a bit line and a complementary bit line each having a first thickness; and
      a Vcc line disposed between the bit line and the complementary bit line; and
   a third metal layer formed over the second metal layer, the third metal layer including a word line having a second thickness greater than the first thickness, wherein the third metal layer further includes a first Vss line that continuously runs parallel with the word line from at least the bit line to at least the complementary bit line.

2. The semiconductor device of claim 1, wherein a ratio of the second thickness to the first thickness is greater than 1.05.

3. The semiconductor device of claim 1, wherein a ratio of the second thickness to the first thickness is greater than 1.15.

4. The semiconductor device of claim 1, wherein the first Vss line is disposed between the word line and another word line of an adjacent SRAM unit cell.

5. The semiconductor device of claim 1, further comprising a fourth metal layer formed over the third metal layer, wherein the fourth metal layer includes a second Vss line electrically coupled to the first Vss line.

6. The semiconductor device of claim 5, wherein the first Vss line runs perpendicular to the second Vss line.

7. The semiconductor device of claim 1, wherein the second metal layer has a greater thickness than the first metal layer.

8. The semiconductor device of claim 1, wherein the SRAM unit cell is a 6T unit cell that includes:
   two cross-coupled inverters having a first data storage node and a second data storage node, each inverter including a pull-down transistor and a pull-up transistor; and
   first and second pass-gate transistors to control data read or data write functions.

9. The semiconductor device of claim 8, wherein the SRAM unit cell further includes a plurality of other transistors for data storage and read/write functionality.

10. The semiconductor device of claim 1, further comprising a fourth metal layer formed over the third metal layer, wherein the fourth metal layer has a greater thickness than the third metal layer such that a thickness ratio of the fourth metal layer to the third metal layer is greater than 1.1.

11. A memory device, comprising:
    a memory unit cell formed in a substrate;
    a first metal layer formed over the substrate, the first metal layer providing local interconnection to the memory unit cell;
    a second metal layer formed over the first metal layer, the second metal layer including a first bit line, a second bit line, and a power supply line disposed between the first and second bit lines;
    a third metal layer formed over the second metal layer, the third metal layer including a word line, wherein the third metal layer further includes a first Vss line that continuously extends parallel to the word line from at least the first bit line to at least the second bit line;
    wherein a length ratio of the word line to the first bit line is greater than about 2.0 in the memory unit cell;
    wherein the first bit line has a first resistance and the word line has a second resistance less than the first resistance.

12. The memory device of claim 11, wherein the first bit line has a first thickness;
    wherein the word line has a second thickness greater than the first thickness; and
    wherein a thickness ratio of the second thickness to the first thickness is greater than 1.05.

13. The memory device of claim 11, wherein the memory unit cell includes a SRAM memory unit cell.

14. The memory device of claim 13, wherein the first Vss is disposed between the word line and another word line of an adjacent memory cell unit.

15. The memory device of claim 14, further comprising a fourth metal layer formed over the third metal layer, wherein the fourth metal layer includes a second Vss line that is perpendicular to the first Vss line, the second Vss line being electrically coupled to the first Vss line.

16. A device, comprising:
    a substrate;
    a memory unit cell in the substrate;
    a first metal layer over the substrate, the first metal layer providing local interconnection to the memory unit cell;
    a second metal layer including a bit line, a complementary bit line, and a Vcc line disposed between the bit line and the complementary bit line, the bit line and the complementary bit line each having a first thickness;
    a third metal layer over the second metal layer, the third metal layer including a word line having a second thickness greater than the first thickness, wherein the third metal layer further includes a first Vss line that continuously extends parallel with the word line from at least the complementary bit line to at least the bit line; and
    a fourth metal layer formed over the third metal layer, wherein the fourth metal layer has a greater thickness than the third metal layer such that a thickness ratio of the fourth metal layer to the third metal layer is greater than 1.1.

17. The device of claim 16, wherein a thickness ratio of the second thickness to the first thickness is greater than 1.05.

18. The device of claim 16, wherein the fourth metal layer includes a second Vss line electrically coupled to the first Vss line, the second Vss line perpendicular to the first Vss line.

19. The memory device of claim 16, further comprising a fourth metal layer formed over the third metal layer, wherein the fourth metal layer has a greater thickness than the third metal layer such that a thickness ratio of the fourth metal layer to the third metal layer is greater than 1.1.

* * * * *